(12) United States Patent
Atkinson

(10) Patent No.: US 6,525,606 B1
(45) Date of Patent: Feb. 25, 2003

(54) VARIABLE GAIN AMPLIFIER

(75) Inventor: Simon Atkinson, Heathfield (GB)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 09/815,698

(22) Filed: Mar. 21, 2001

(51) Int. Cl.[7] ................................................ H03G 5/16
(52) U.S. Cl. ..................... 330/133; 330/254; 327/359
(58) Field of Search ................................ 330/133, 134, 330/254; 327/359, 346

(56) References Cited

U.S. PATENT DOCUMENTS

| | | | | |
|---|---|---|---|---|
| 5,216,384 A | * | 6/1993 | Vanhecke | 330/133 |
| 5,841,320 A | * | 11/1998 | Ichihara | 330/133 |
| 6,049,252 A | * | 4/2000 | Iwata | 330/133 |
| 6,100,760 A | * | 8/2000 | Maruyama et al. | 327/359 |
| 6,229,395 B1 | * | 5/2001 | Kay | 327/359 |
| 6,326,842 B1 | * | 12/2001 | Kuroda | 330/133 |
| 6,333,675 B1 | * | 12/2001 | Saito | 330/133 |

* cited by examiner

Primary Examiner—Robert Pascal
Assistant Examiner—Khanh Van Nguyen
(74) Attorney, Agent, or Firm—Samuels, Gauthier & Stevens, LLP

(57) ABSTRACT

A variable gain amplifier system for radio frequency signals is disclosed. The system provides a relatively constant gain change in decibels responsive to an incremental change in control voltage. The system includes two or more cascaded gain stage amplifiers. Each gain stage amplifier is adjustable between a first gain setting and a second gain setting.

14 Claims, 7 Drawing Sheets

VARIABLE GAIN AMPLIFIER

BACKGROUND OF THE INVENTION

The invention relates to the field of variable gain amplifiers, and particularly relates to the field of variable gain amplifiers for high frequency signals such as radio frequency (RF) signals.

For certain applications, it is desirable that variable gain amplifiers provide a fixed gain change in decibels responsive to an incremental change in control voltage. This feature is generally known as being linear in dB. It is also desirable that variable gain amplifiers be economical yet accurate and precise, and that they operate at a stable temperature throughout the gain range.

There is a need for an improved variable gain amplifier for high frequency signals that is linear in dB and is temperature stable.

SUMMARY OF THE INVENTION

The invention provides a variable gain amplifier system for radio frequency signals. The amplifier system of the invention provides a relatively constant gain change in decibels responsive to an incremental change in control voltage. The system includes two or more cascaded gain stage amplifiers, and each gain stage amplifier is adjustable between a first gain setting and a second gain setting.

In an embodiment, the invention includes three gain stage amplifiers. The first gain stage amplifier has an input, an output, a first reference signal input and second reference signal input. The second gain stage amplifier has an input that is coupled to the output of the first gain stage amplifier, an output, a first reference signal input and a second reference signal input. The third gain stage amplifier has an input that is coupled to the output of the second gain stage amplifier, an output, a first reference signal and a second reference signal.

BRIEF DESCRIPTION OF THE DRAWINGS

The following description may be further understood when with reference to the accompanying drawings in which.

DETAILED DESCRIPTION OF THE INVENTION

Figure 1:
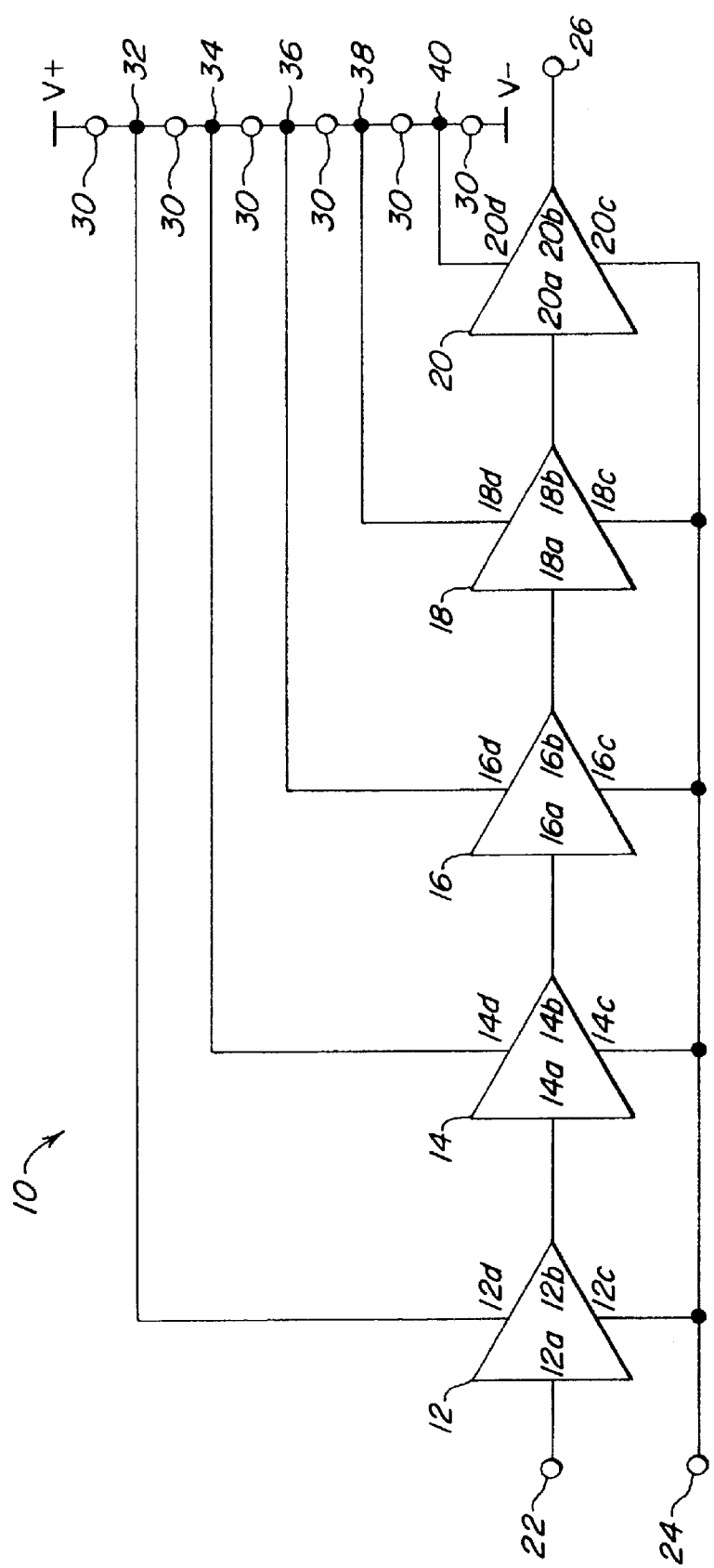
FIG. 1 shows diagrammatic circuit representation of a system of the invention.

As shown in FIG. 1, a circuit 10 in accordance with an embodiment of the invention includes a plurality of cascaded gain stage amplifiers 12, 14, 16, 18 and 20. Generally, an input signal ($V_{IN}$) may be presented at input 22. The gain of the input signal may be variably adjusted by controlling the voltage ($V_{CTRL}$) at the gain control input 24. The variable gain amplifier output signal ($V_{OUT}$) is provided at 26.

Specifically, each gain stage amplifier 12, 14, 16, 18 and 20 includes an input port 12a, 14a, 16a, 18a, and 20a respectively, and includes an output port 12b, 14b, 16b, 18b, and 20b respectively. Each gain stage amplifier 12, 14, 16, 18 and 20 also includes two reference inputs 12c-12d, 14c-14d, 16c-16d, 18c-18d, and 20c-20d respectively. The variable reference inputs 12c, 14c, 16c, 18c and 20c are commonly coupled to the gain control input 24. The fixed reference inputs 12d, 14d, 16d, 18d and 20d are each coupled to mutually successively offset bias voltages as shown at 32, 34, 36, 38 and 40 respectively. The bias voltage at each of nodes 32, 34, 36, 38 and 40 is mutually successively offset by a fixed voltage ($V_{OFF}$), which is provided by a plurality of voltage sources 30 connected in series between a source voltage V+ and a circuit ground (V−) as shown in FIG. 1.

Figure 2:
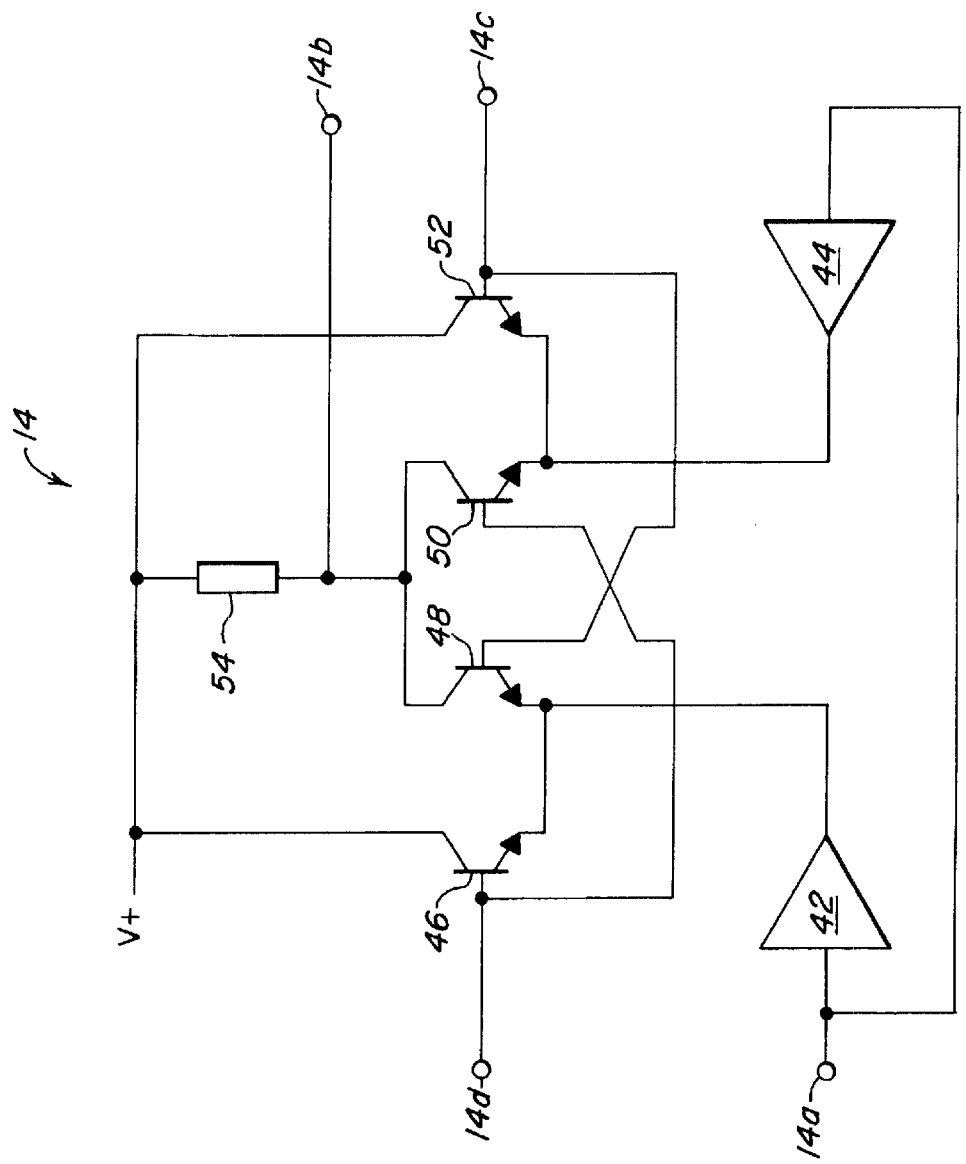
FIG. 2 shows a diagrammatic circuit representation of a portion of the circuit of FIG. 1.

A diagrammatic view of a circuit representation of a single gain stage amplifier of FIG. 1 (e.g., gain stage amplifier 14) is shown in FIG. 2. As shown in FIG. 2, each gain stage amplifier includes a pair of transconductance stages 42, 44, and a current steering network including transistors 46, 48, 50 and 52. During operation, if the reference voltage at input 14c is significantly greater than the voltage at the reference 14d, then transistors 46 and 50 are biased off and transistors 48 and 52 are biased fully on. In this case, all of the signal current from transconductor stage 42 is directed to the load resistor 54, and all of the signal current from the transconductor stage 44 is directed to the voltage source V+. In this state, the gain of the stage is the gain of the transconductor stage 42 (Gm1) multiplied by the value of the load resistor 54 ($R_L$).

With a total of N cascaded stages and the condition that the voltage at the reference inputs 12c, 14c, 16c, 18c and 20c are each significantly greater than the reference voltages 12d, 14d, 16d, 18d and 20d respectively, then the total gain will be N×Gm1×$R_L$. If, on the other hand, the fixed reference voltage of any stage (e.g., 14d) is significantly greater than the variable reference voltage (e.g., 14c), then the gain for that stage is Gm2×$R_L$ where Gm2 is the gain of the transconductance stage 44. With a total of N cascaded stages, therefore, and the condition that the voltage at the inputs 12c, 14c, 16c, 18c and 20c are each significantly less than the voltages at 12d, 14d, 16d, 18d and 20d respectively, then the total gain will be N×Gm2×$R_L$.

The difference in gain between the two extreme states may be determined by knowing that 20×Log {Gm1/Gm2}=X dB. The difference in gain between the extreme states is N×X (in dB). For applied voltages where the reference voltage (e.g., 14d) equals the input voltage (e.g., 14c), then the gain of an individual stage will be an intermediate value between the two extremes. If the gain adjustment is applied sequentially to the individual stages, then the resultant characteristic of gain (in dBs) is approximately linear with the applied voltage.

Figure 3:
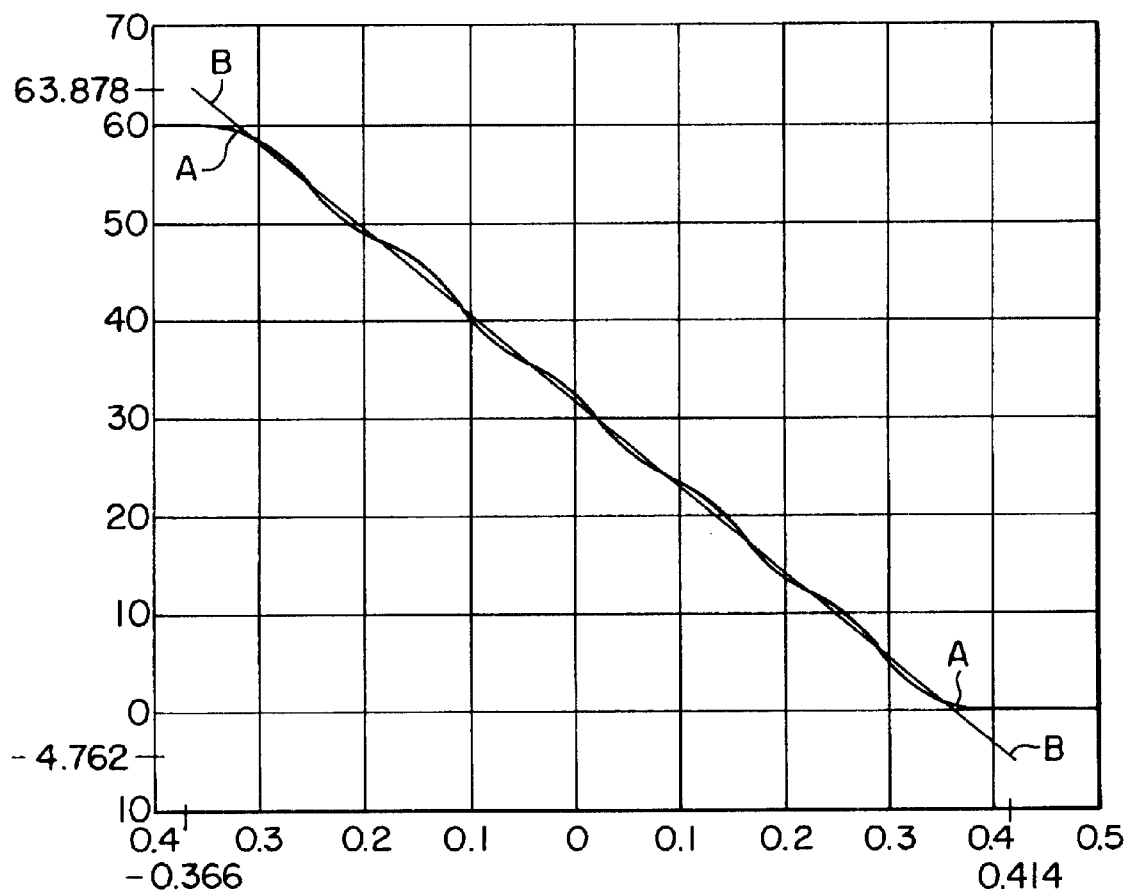
FIG. 3 shows a diagrammatic graphic representation of the gain verses voltage for a system of the invention.

As shown in FIG. 3, the gain (in dB) along the vertical axis versus the control voltage $V_{CTRL}$ along the horizontal axis. If the gain adjustment is applied sequentially to the individual stages, then the resultant characteristic of gain (in dB) as shown at A is approximately linear as shown at B. The linear line shown as B for purposes of illustration demonstrates that the gain is approximately linear with respect to the applied voltage $V_{CTRL}$. The sequential application of gain reduction is achieved by offsetting the reference voltage by a fixed amount between adjacent stages ($V_{OFF}$). Using this method, it is possible to progressively apply a gain reduction of N×X (in dB) by applying gain reduction to the last stage first, the penultimate stage second, etc. This approach ensures that both the noise performance and the compression performance of the amplifier is optimized.

The approximation to the logarithmic characteristic is achieved by what is essentially a curve fitting process. If the gain is being progressively reduced, the as one stage is approaching minimum gain, then the preceding stage is starting to transition from maximum gain towards minimal gain. The overlap of these two regions facilitates compensation for non-linear characteristics that occur close to both minimum and maximum gain.

In the example shown in FIG. 3, there are five cascaded identical gain stages, each having a maximum gain of 12 dB, and a minimum gain of 0 dB. The applied offset voltage per stage is 137 mV. The line shown at B is an ideal logarithmic characteristic.

Figure 4:
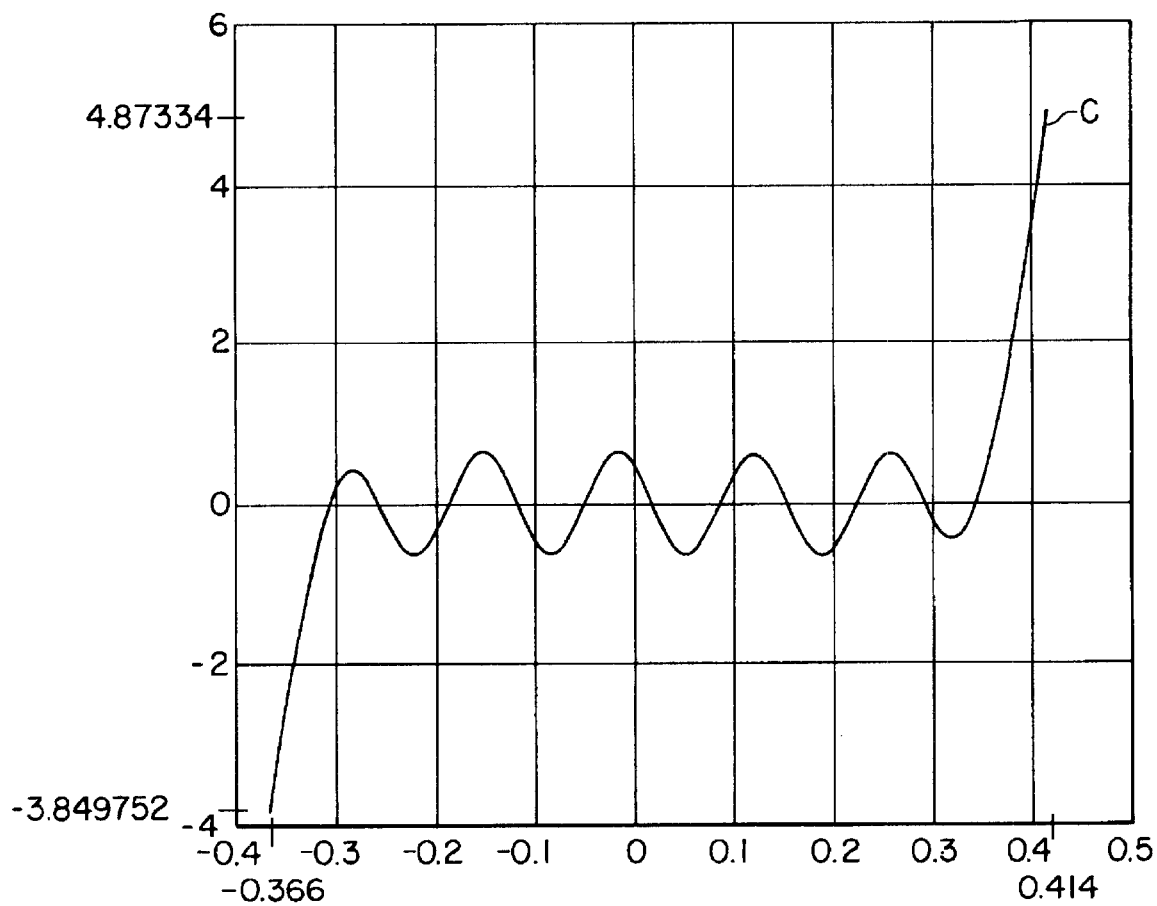
FIG. 4 shows a diagrammatic graphic representation of the logarithmic conformance of a system of the invention.

As shown at C in FIG. 4, it is possible that an error of about 0.5 dB to the ideal may be maintained across a gain reduction range of 58 dB. Figure C shows the logarithmic conformance with the voltage $V_{CRTL}$ shown along the horizontal axis, and the associated non-conformance error shown along the vertical axis. Lower levels of ripple in the middle of the range may be achieved by reducing the $V_{OFF}$, although such reduction may affect the performance at the ends of the operation range.

Figure 5:
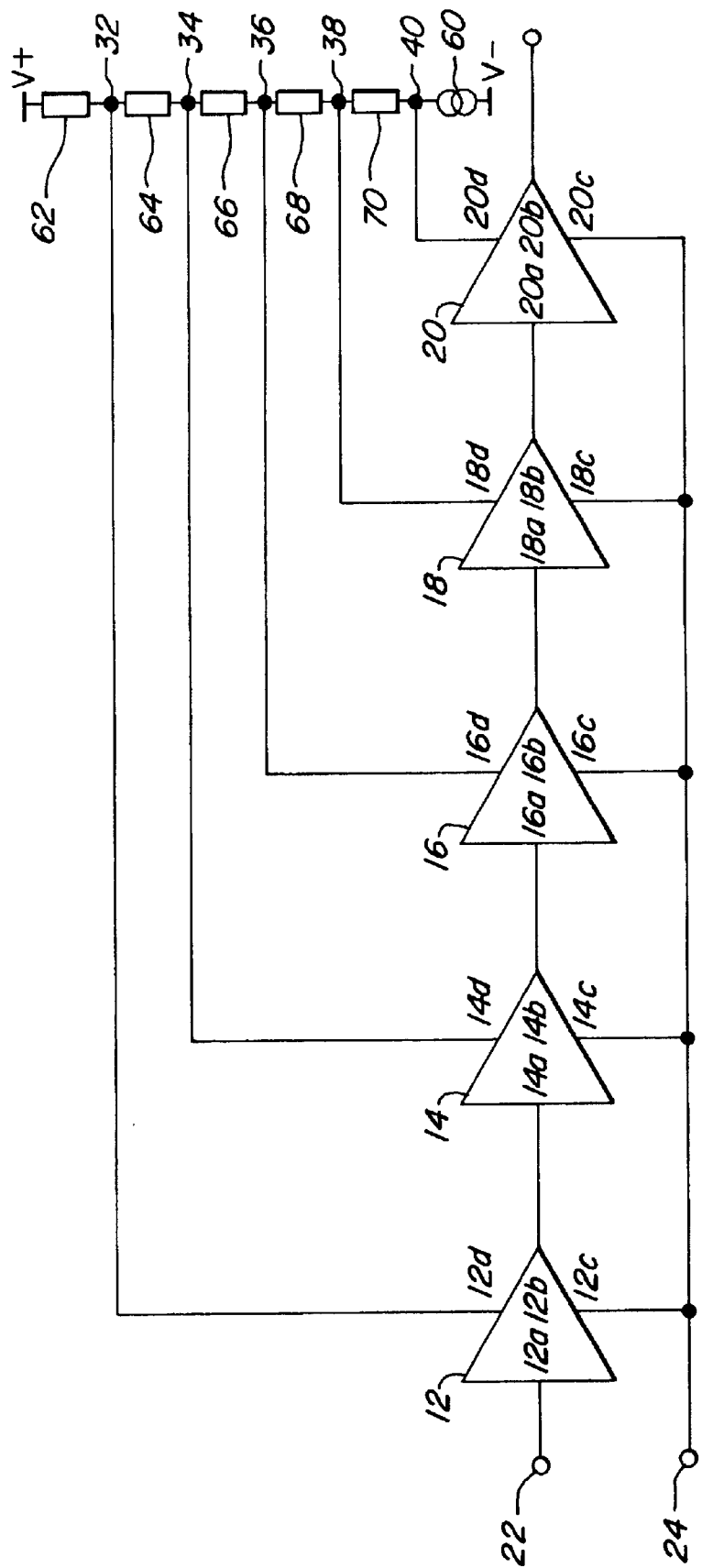
FIG. 5 shows a diagrammatic circuit representation of a system in accordance with a further embodiment of the invention.

For certain implementations, the individual stages may be made fully differential and the offset voltage $V_{OFF}$ may be generated by the method shown in FIG. 5. It may also be shown that for correct temperature compensation, both the applied gain control voltage $V_{CTRL}$ and the offset voltage $V_{OFF}$ should both have a desirable proportional to absolute temperature (PTAT) characteristic. This will ensure that at any gain setting, the overall gain will remain constant with temperature variations.

FIG. 5 shows another embodiment of a system of the invention in which the mutually successively offset voltages 12d, 14d, 16d, 18d and 20d are established by a single current source 60 that is connected in series with resistors 62, 64, 66, 68 and 70 as shown.

Figure 6:
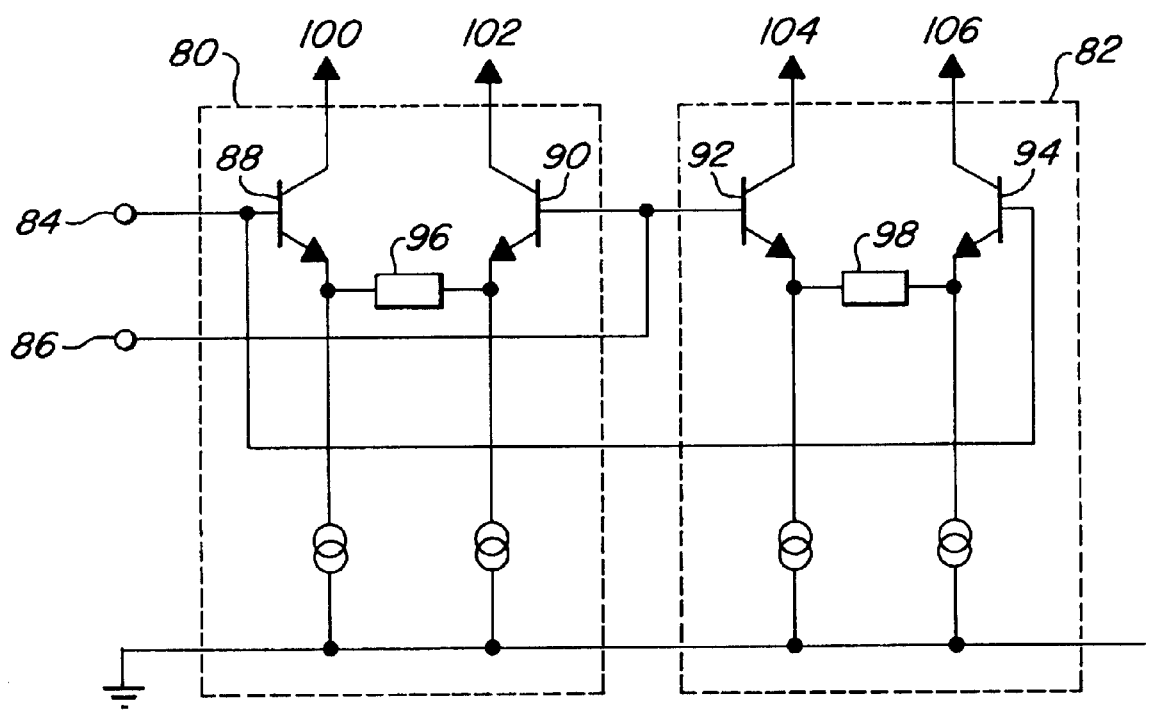
FIG. 6 shows a diagrammatic circuit representation of a portion of the circuit of FIG. 5.
Figure 7:
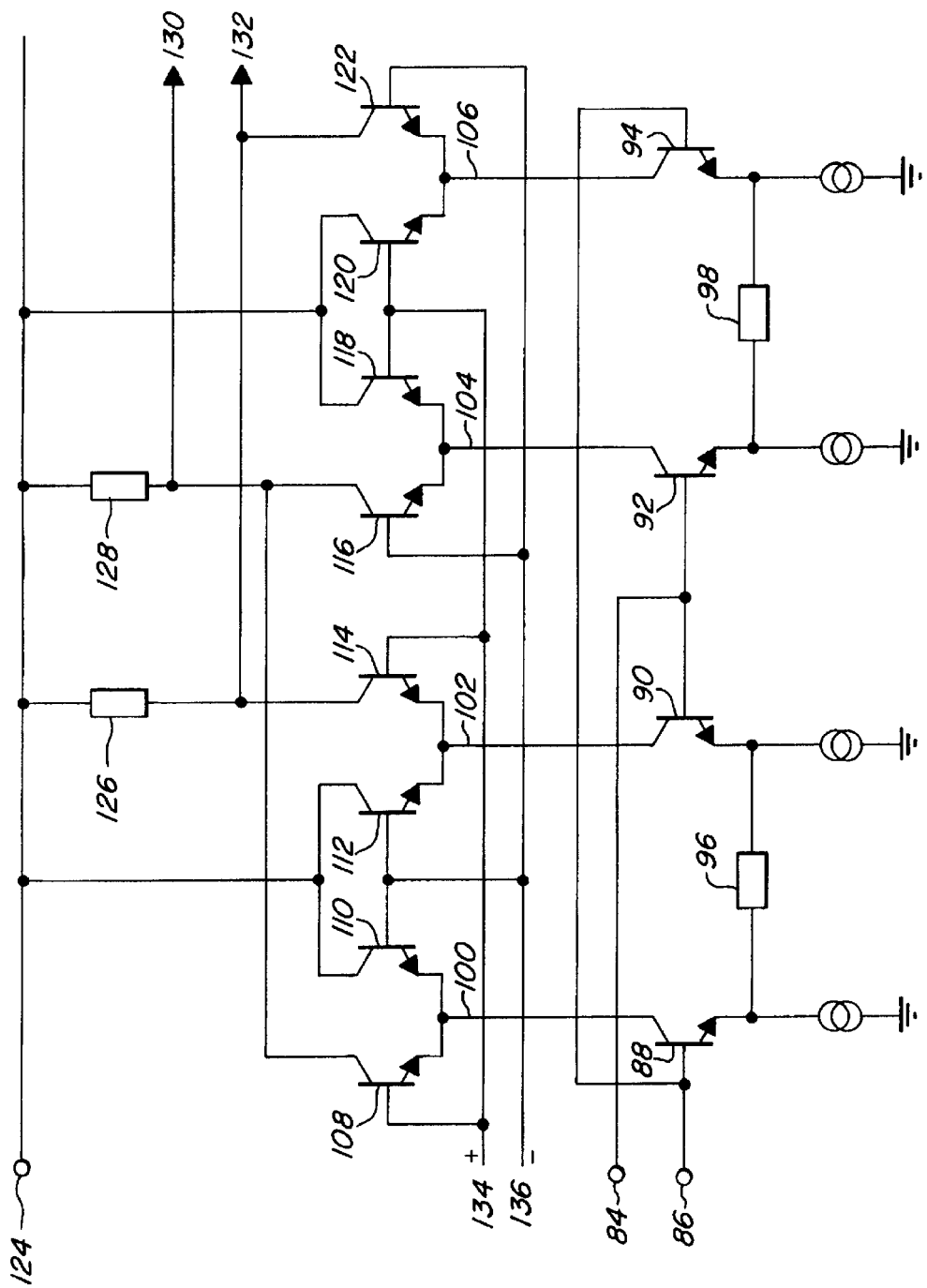
FIG. 7 shows a diagrammatic circuit representation of the circuit of FIG. 6 in a system in accordance with an embodiment of the invention.

The dynamic range of the overall solution will be optimized if the reduction in transconductance (between Gm1 and Gm2) is achieved by increasing the level of resistive degeneration. In particular, FIG. 6 shows a differential implementation of the transconductor stages. As shown in FIG. 6, transconductor stages 80 and 82 include differential input ports 84 and 86, as well as two pairs of transistors 88, 90 and 92, 94. The emitters of transistors 88 and 90 are coupled together at each end of a resistor 96, and the emitters of transistors 92 and 94 are coupled together at each end of another resistor 98. The resistance of the two resistors 96 and 98 should be dissimilar.

The collectors of the transistors 88, 90, 92 and 94 of the transconductor stages 80 and 82 are coupled to current steering networks similar to those discussed above with reference to FIG. 2. In particular, the collector of transistor 88 is coupled to the commonly connected emitters of transistors 108 and 110, the collector of transistor 90 is coupled to the commonly connected emitters of transistors 112 and 114, the collector of transistor 92 is coupled to the commonly connected emitters of transistors 116 and 118, and the collector of transistor 94 is coupled to the commonly connected emitters of transistors 120 and 122. The collectors of transistors 110, 112, 118 and 120 are commonly coupled to the voltage source 124. The collectors of transistors 108 and 116 are commonly coupled to the voltage source 124 via a resistor 128, and the collectors of transistors 114 and 122 are commonly coupled to the voltage source 124 via another resistors 126. The differential output of the gain stage is provided at 130 and 132, while the differential reference input is received at inputs 134 and 136.

Those skilled in the art will appreciate that numerous modifications and variations may be made to the above disclosed embodiments without departing from the spirit and scope of the invention. For example, it will be appreciated that the types of transistors used may be changed even though such changes may require reversing the polarity or arranged of certain components as is commonly known. In further embodiments, the characteristic of gain may be approximately linear in scales other than a logarithmic scale with respect to voltage input signals applied to a gain control input.

What is claimed is:

1. A variable gain stage amplifier, for radio frequency signals, said system providing a relatively constant gain change responsive to an incremental change in control voltage, said system comprising:

a first gain stage amplifier including an input, an output, a first reference signal input and second reference signal input;

a second gain stage amplifier including an input that is coupled to the output of said first gain stage amplifier, an output, a first reference signal input and a second reference signal input; and a third gain stage amplifier including an input that is coupled to the output of said second gain stage amplifier, an output, a first reference signal and a second reference signal, wherein said first reference signal input of each of said first, second and third gain stage amplifiers are commonly coupled to a gain control input port, and wherein said second reference signal inputs of said first, second and third gain stage amplifiers are coupled to mutually successively offset bias voltages.

2. A variable gain stage amplifier as claimed in claim 1, wherein said mutually successively offset bias voltages are provided by a plurality of voltage sources coupled to one another in series.

3. A variable gain stage amplifier as claimed in claim 2, wherein said plurality of voltage sources are provided by a plurality of voltage power supplies.

4. A variable gain stage amplifier as claimed in claim 2, wherein said plurality of voltage sources are provided by a plurality of resistors that are coupled to one another in series between a voltage supply and ground.

5. A variable gain stage amplifier as claimed in claim 1, wherein the characteristic of gain is approximately linear with respect to voltage signals applied to said first reference signal inputs of each of said first, second and third gain stages.

6. A variable gain stage amplifier as claimed in claim 5, wherein the characteristic of gain is approximately linear in decibels with respect to voltage signals applied to said first reference signal inputs of each of said first, second and third gain stages.

7. A variable gain stage amplifier as claimed in claim 5, wherein the voltage signals applied to said first reference signal inputs of each of said first, second and third gain stages are equal to one another.

8. A variable gain stage amplifier system for radio frequency signals, said system providing a relatively constant gain change at a system output port responsive to an incremental change in control voltage applied at a control voltage input port, said system comprising a plurality of cascaded gain stage amplifiers, each gain stage amplifier being adjustable between a first gain setting and a second gain setting, said first and second gain settings for each gain stage amplifier being provided by first and second reference signals that are applied to each of said gain stage amplifiers, wherein said second reference signals that are applied to each of said gain stage amplifiers are coupled to mutually successively offset bias reference voltages sources.

9. A variable gain stage amplifier as claimed in claim 8, wherein said first reference signals that are applied to each of said gain stage amplifiers are equal to one another and are coupled to the control voltage input port.

10. A variable gain stage amplifier as claimed in claim 9 wherein the characteristic of gain is approximately linear with respect to voltage applied to the control voltage input port.

11. A variable gain stage amplifier as claimed in claim 10, wherein the characteristic of gain is approximately linear in decibels with respect to the voltage applied to the control voltage input port.

12. A variable gain stage amplifier system for radio frequency signals, said system providing a relatively constant gain change in decibels at a system output port responsive to an incremental change in control voltage applied at a control voltage input port, said system comprising:

a plurality of gain stage amplifiers including an input port, an output port, and a first and second reference port, said gain stage amplifiers being coupled together in series such that the output of each gain stage amplifier is coupled to the input of another gain stage amplifier, each gain stage amplifier being adjustable between a first gain setting and a second gain setting, said first and second gain settings for each gain stage amplifier being provided by first and second reference signals that are provided respectively to the first and second reference ports of each of said gain stage amplifiers, said first reference signal port of each gain stage amplifier being coupled to the control voltage input port of the system, and said second reference port signal of each of said gain stage amplifiers being respectively coupled to one of a plurality of independently adjustable voltage supplies.

13. A variable gain stage amplifier system as claimed in claim 12, wherein said system provides an approximately linear gain change in decibels responsive to an approximately linear change in control voltage.

14. A variable gain stage amplifier system as claimed in claim 12, wherein said plurality of independently adjustable voltage supplies are mutually offset from one another by a fixed offset voltage.

* * * * *